United States Patent
Jeong

(10) Patent No.: US 9,236,544 B2
(45) Date of Patent: Jan. 12, 2016

(54) LIGHT EMITTING DEVICE

(71) Applicant: LG INNOTEK CO., LTD., Seoul (KR)

(72) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 147 days.

(21) Appl. No.: 13/960,280

(22) Filed: Aug. 6, 2013

(65) Prior Publication Data

US 2014/0042474 A1  Feb. 13, 2014

(30) Foreign Application Priority Data

Aug. 7, 2012 (KR) .................... 10-2012-0086061

(51) Int. Cl.
*H01L 33/60* (2010.01)
*H01L 33/14* (2010.01)
*H01L 33/38* (2010.01)
*H01L 33/40* (2010.01)

(52) U.S. Cl.
CPC .............. *H01L 33/60* (2013.01); *H01L 33/145* (2013.01); *H01L 33/382* (2013.01); *H01L 33/405* (2013.01)

(58) Field of Classification Search
CPC ..... H01L 33/145; H01L 33/20; H01L 33/405; H01L 33/60; H01L 33/382
See application file for complete search history.

(56) References Cited

U.S. PATENT DOCUMENTS

| | | |
|---|---|---|
| 2010/0213481 A1 | 8/2010 | Hwang |
| 2011/0062488 A1 | 3/2011 | Uemura |
| 2011/0210362 A1* | 9/2011 | Lee et al. .................... 257/98 |
| 2011/0241050 A1* | 10/2011 | Ye et al. ..................... 257/98 |
| 2011/0266568 A1 | 11/2011 | Aldaz |
| 2012/0194103 A1* | 8/2012 | Odnoblyudov ....... H01L 33/382 315/363 |
| 2012/0280269 A1 | 11/2012 | Jeong |

FOREIGN PATENT DOCUMENTS

| | | |
|---|---|---|
| CN | 101877379 A | 11/2010 |
| CN | 102024892 A | 4/2011 |
| CN | 102237460 A | 11/2011 |
| CN | 102447031 A | 5/2012 |
| JP | 2011-066048 A | 3/2011 |
| JP | 2011-233881 A | 11/2011 |
| JP | 4982625 B1 | 7/2012 |

OTHER PUBLICATIONS

Japanese Office Action dated Jul. 15, 2014 issued in Application No. 2013-162876.
Chinese Office Action issued in Application No. 201310340983.9 dated Aug. 28, 2015.

* cited by examiner

*Primary Examiner* — Jerome Jackson, Jr.
*Assistant Examiner* — Mohammed R Alam
(74) *Attorney, Agent, or Firm* — KED & Associates LLP

(57) ABSTRACT

A light emitting structure including a first conductive semiconductor layer, an active layer, and a second conductive semiconductor layer. A first electrode is electrically coupled to the first conductive semiconductor layer. A current blocking layer is provided adjacent to the light emitting structure, and includes a top surface disposed in the first conductive semiconductor layer by passing through the active layer. A first metal layer is provided over the current blocking layer and contacts the first conductive semiconductor layer, and a reflective electrode is electrically coupled to the second conductive semiconductor layer.

20 Claims, 14 Drawing Sheets

LIGHT EMITTING DEVICE

CROSS-REFERENCE TO RELATED APPLICATIONS

The present application claims priority under 35 U.S.C. 119 to Korean Patent Application No. 10-2012-0086061 filed on Aug. 7, 2012, which is hereby incorporated by reference in its entirety.

BACKGROUND

The embodiment relates to a light emitting device, a light emitting device package, and a light unit.

A light emitting diode (LED) has been extensively used as one of light emitting devices. The LED converts electrical signals into the form of light such as infra-red light, visible light and ultra-violet light by using the characteristic of a compound semiconductor.

As the light efficiency of the light emitting device is increased, the light emitting device has been used in various fields such as display apparatuses and lighting appliances.

The above references are incorporated by reference herein where appropriate for appropriate teachings of additional or alternative details, features and/or technical background.

SUMMARY

The embodiment provides a light emitting device, a light emitting device package, and a light unit, which can improve an operating voltage and an electric reliability while preventing damage in a higher field.

A light emitting device according to the embodiment comprises a light emitting structure comprising a first conductive semiconductor layer, an active layer under the first conductive semiconductor layer, and a second conductive semiconductor layer under the active layer; a first electrode electrically connected to the first conductive semiconductor layer; a current blocking layer disposed under the light emitting structure and having a top surface disposed in the first conductive semiconductor layer by passing through the active layer; a first metal layer disposed on the current blocking layer and contacting the first conductive semiconductor layer; and a reflective electrode electrically connected to the second conductive semiconductor layer.

A light emitting device according to the embodiment comprises a light emitting structure comprising a first conductive semiconductor layer, an active layer under the first conductive semiconductor layer, and a second conductive semiconductor layer under the active layer; a first electrode electrically connected to the first conductive semiconductor layer; a current blocking layer disposed under the light emitting structure and having a top surface disposed in the first conductive semiconductor layer by passing through the active layer; a first metal layer disposed on the current blocking layer and contacting the first conductive semiconductor layer; and a reflective electrode electrically connected to the second conductive semiconductor layer, wherein lateral surfaces and a bottom surface of the first metal layer are surrounded by the current blocking layer, and wherein a top surface of the first metal layer is located higher than a top surface of the active layer.

A light emitting device according to the embodiment comprises a light emitting structure comprising a first conductive semiconductor layer, an active layer under the first conductive semiconductor layer, and a second conductive semiconductor layer under the active layer; a first electrode electrically connected to the first conductive semiconductor layer; a current blocking layer disposed under the light emitting structure and having a top surface disposed in the first conductive semiconductor layer by passing through the active layer; a first metal layer disposed on the current blocking layer and contacting the first conductive semiconductor layer; a reflective electrode electrically connected to the second conductive semiconductor layer; a channel layer around a lower portion of the light emitting structure; and a second metal layer disposed on the channel layer and contacting the first conductive semiconductor layer.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
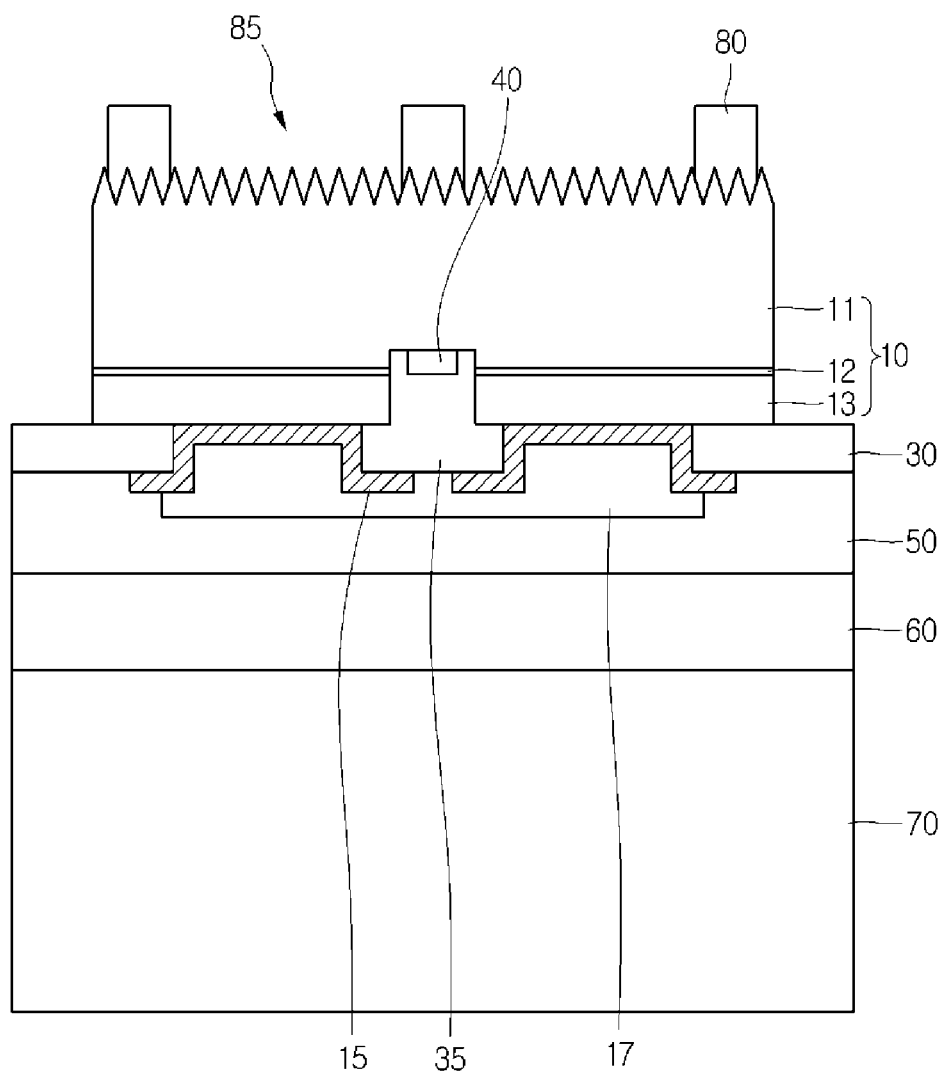
FIG. 1 is a view showing a light emitting device according to an embodiment.

In the description of an embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit, and a method for manufacturing the light emitting device according to the embodiments will be described in detail with reference to accompanying drawings.

FIG. 1 is a view showing a light emitting device according to an embodiment.

As shown in FIG. 1, the light emitting device according to the embodiment may comprise a light emitting structure 10, a reflective electrode 17, a current blocking layer 35, a first metal layer 40, and a first electrode 80.

The light emitting structure 10 may comprise a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be disposed under the first conductive semiconductor layer 11 and the second conductive semiconductor layer 13 may be disposed under the active layer 12.

For example, the first conductive semiconductor layer 11 may comprise an N-type semiconductor layer doped with N-type dopants serving as first conductive dopants, and the second conductive semiconductor layer 13 may comprise a P-type semiconductor layer doped with P-type dopants serving as second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor layer. The first conductive semiconductor layer 11 may be realized by using a compound semiconductor. The first conductive semiconductor layer 11 may be realized by using a group II-VI compound semiconductor or a group III-V compound semiconductor.

For example, the first conductive semiconductor layer 11 may be realized by using a semiconductor material having a compositional formula of $In_xAl_yGa_{1-x-y}N$ ($0 \le x \le 1$, $0 \le y \le 1$, $0 \le x+y \le 1$). For example, the first conductive semiconductor layer 11 may comprise one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 12 through the combination of electrons (or holes) injected through the first conductive semiconductor layer 11 and holes (or electrons) injected through the second conductive semiconductor layer 13. The active layer 12 may have one of a single quantum well structure, a multi-quantum well structure, a quantum dot structure, and a quantum wire structure, but the embodiment is not limited thereto.

The active layer 12 may be realized by using a compound semiconductor. For example, the active layer 12 may be realized by using a group II-VI compound semiconductor or a group III-V compound semiconductor. For example, the active layer 12 may be realized by using a semiconductor material having a compositional formula of $In_xAl_yGa_{1-x-y}N$ ($0 \le x \le 1$, $0 \le y \le 1$, $0 \le x+y \le 1$). When the active layer 12 has the multi-quantum well structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may comprise a P-type semiconductor layer. The second conductive semiconductor layer 13 may be realized by using a compound semiconductor. For example, the second conductive semiconductor layer 13 may be realized by using a group II-VI compound semiconductor or a group III-V compound semiconductor.

For example, the second conductive semiconductor layer 13 may be realized by using a semiconductor material having a compositional formula of $In_xAl_yGa_{1-x-y}N$ ($0 \le x \le 1$, $0 \le y \le 1$, $0 \le x+y \le 1$). For example, the second conductive semiconductor layer 13 may comprise one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be additionally disposed under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

The light emitting device according to the embodiment may comprise the current blocking layer 35 disposed under the light emitting structure 10. The current blocking layer 35 has a top surface disposed in the first conductive semiconductor layer 11 by passing through the active layer 12. The top surface of the current blocking layer 35 can make contact with the first conductive semiconductor layer 11. A portion of the top surface of the current blocking layer 35 and a portion of lateral surfaces of the current blocking layer 35 may physically make contact with the first conductive semiconductor layer 11.

The first metal layer 40 may be disposed on the current blocking layer 35. The first metal layer 40 may be disposed in the first conductive semiconductor layer 11. The first metal layer 40 may make contact with the first conductive semiconductor layer 11.

The first metal layer 40 can make ohmic-contact with the first conductive semiconductor layer 11. Lateral surfaces of the first metal layer 40 may be surrounded by the current blocking layer 35. A bottom surface of the first metal layer 40 may be surrounded by the current blocking layer 35.

A top surface of the first metal layer 40 may be located higher than a top surface of the active layer 12. For example, the first metal layer 40 may have a width in the range of 5 μm to 100 μm and a thickness in the range of 1 nanometer to 1000 nanometer.

The first electrode 80 may be electrically connected to the first conductive semiconductor layer 11. The first electrode 80 may be disposed on the first conductive semiconductor layer 11. The first electrode 80 can make contact with the first conductive semiconductor layer 11. The first metal layer 40 may overlap with the first electrode 80 in the vertical direction.

The reflective electrode 17 may be electrically connected to the second conductive semiconductor layer 13. The reflective electrode 17 may be disposed under the second conductive semiconductor layer 13. A portion of the reflective electrode 17 can make contact with the current blocking layer 35. A top surface of the reflective electrode 17 may make contact with a bottom surface of the current blocking layer 35.

The light emitting device according to the embodiment may comprise a channel layer 30 disposed around a lower portion of the light emitting structure 10. The channel layer 30 may be disposed around a lower portion of the second conductive semiconductor layer 13. The channel layer 30 may be disposed between the second conductive semiconductor layer 13 and the reflective electrode 17. The channel layer 30 can make contact with a bottom surface of the second conductive semiconductor layer 13

The channel layer 30, for example, can be implemented by using oxide or nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be called an isolation layer. The channel layer 30 may serve as an etching stopper when the isolation process is performed later with respect to the light emitting structure 10 and may prevent the electric characteristic of the light emitting device from being deteriorated due to the isolation process.

The light emitting device according to the embodiment may comprise an ohmic contact layer 15 disposed between the reflective electrode 17 and the second conductive semiconductor layer 13. The ohmic contact layer 15 can make contact with the second conductive semiconductor layer 13.

The ohmic contact layer 15 can make ohmic-contact with the light emitting structure 10. The ohmic contact layer 15 can be electrically connected to the second conductive semiconductor layer 13. In addition, the ohmic contact layer 15 may increase quantity of light extracted to the outside by reflecting light incident from the light emitting structure 10.

The ohmic contact layer 15 may be formed by using a transparent conductive oxide layer. For instance, the ohmic contact layer 15 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective electrode 17 may be formed by using a material having high reflectivity. For instance, the reflective electrode 17 may be formed by using a metal or an alloy comprising at least one of Ag, Ni, Al, Rh, Pd, Ir, Ru, Mg, Zn, Pt, Cu, Au, and Hf. In addition, the reflective electrode 17 may be prepared as multi-layers by using the above metal or alloy and a transparent conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the reflective electrode 17 according to the embodiment may comprise at least one of Ag, Al, Ag—Pd—Cu alloy and Ag—Cu alloy.

For example, the reflective electrode 17 may be prepared by alternately forming an Ag layer and a Ni layer or may comprise Ni/Ag/Ni, a Ti layer or a Pt layer. In addition, the ohmic contact layer 15 is formed under the reflective electrode 17 and at least a portion of the ohmic contact layer 17 can make ohmic-contact with the light emitting structure 10 through the reflective electrode 17.

The first metal layer 40 may comprise at least one of Al, Ag, Ti, V, Cr, Pt, V, Ni, and W. The first metal layer 40 may have a shape corresponding to a shape of the first electrode 80.

The current blocking layer 35 may prevent the current flow from being concentrated on a specific part so the current blocking layer 35 may improve the reliability of the light emitting device. The current blocking layer 35, for example, may be formed by using oxide or nitride. For example, the current blocking layer 35 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The light emitting device according to the embodiment may comprise a third metal layer 50 disposed under the reflective electrode 17.

The third metal layer 50 may comprise at least one of Cu, Ni, Ti, Ti—W, Cr, W, Pt, V, Fe, and Mo. The third metal layer 50 may serve as a diffusion barrier layer. A bonding layer 60 and a support member 70 may be disposed under the third metal layer 50.

The third metal layer 50 may prevent the material included in the bonding layer 60 from being diffused to the reflective electrode 17 when the bonding layer 60 is provided. The third metal layer 50 may prevent the material, such as Sn, included in the bonding layer 60 from exerting an influence upon the reflective electrode 17.

The bonding layer 60 may comprise a barrier metal or a bonding metal. For instance, the bonding layer 60 may comprise at least one of Ti, Au, Sn, Ni, Cr, Ga, In, Bi, Cu, Ag, Nb, Pd and Ta. The support member 70 supports the light emitting structure 10 and performs the heat dissipation function. The bonding layer 60 may be implemented as a seed layer.

For example, the support member 70 may comprise at least one of Ti, Cr, Ni, Al, Pt, Au, W, Cu, Mo, Cu—W and a semiconductor substrate doped with impurities (i.e., Si, Ge, GaN, GaAs, ZnO, SiC, or SiGe). For example, the support member 70 may be formed by using an insulating material.

According to the embodiment, the power can be applied to the light emitting structure 10 through the reflective electrode 17 and the first electrode 80. According to the embodiment, the first electrode 80 may comprise an ohmic layer, an intermediate layer and an upper layer. The ohmic layer may comprise one selected from Cr, V, W, Ti and Zn to realize the ohmic contact. The intermediate layer may comprise one selected from Ni, Cu, and Al. The upper layer, for example, may comprise Au. The first electrode 80 may comprise at least one of Cr, V, W, Ti, Zn, Ni, Cu, Al, Au, and Mo.

A roughness 85 may be formed on the first conductive semiconductor layer 11. Thus, the quantity of light extracted in the upward direction can be increased at the region where the roughness 85 is formed.

The light emitting device according to the embodiment may comprise the first metal layer 40 disposed in the first conductive semiconductor layer 11. The first metal layer 40 may have the potential the same as that of the first electrode 80. Since the first metal layer 40 and the first electrode 80 have the same potential, the first metal layer 40 may have resistance against the instant high field. The current spreading effect may be realized by the first metal layer 40. In addition, the operating voltage may be improved, the damage may be prevented in the higher field and the electric reliability can be improved by the first metal layer 40.

Hereinafter, a method for manufacturing the light emitting device according to the embodiment will be described with reference to FIGS. 2 to 7.

Figure 2:
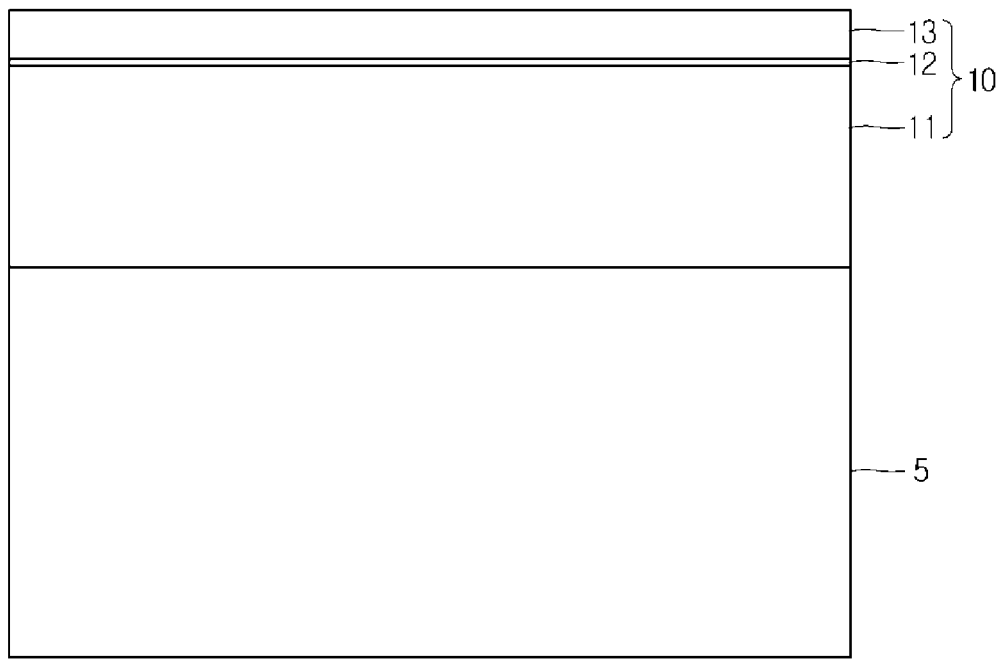
FIGS. 2 to 7 are sectional views showing a method for manufacturing the light emitting device according to an embodiment.

According to the method for manufacturing the light emitting device according to the embodiment, as shown in FIG. 2, the first conductive semiconductor layer 11, the active layer 12, and the second conductive semiconductor layer 13 are formed on the substrate 5. The first conductive semiconductor layer 11, the active layer 12, and the second conductive semiconductor layer 13 may constitute the light emitting structure 10.

For example, the substrate 5 may comprise at least one selected from the group consisting of sapphire ($Al_2O_3$), SiC, GaAs, GaN, ZnO, Si, GaP, InP, and Ge, but the embodiment is not limited thereto. A buffer layer may be additionally provided between the first conductive semiconductor layer 11 and the substrate 5.

For example, the first conductive semiconductor layer 11 may comprise an N type semiconductor layer doped with N-type dopants serving as first conductive dopants, and the second conductive semiconductor layer 13 may comprise a P type semiconductor layer doped with P-type dopants serving as the second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor layer. The first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of InAlGaN, GaN, AlGaN, AlInN, InGaN, AlN, and InN and may be doped with N-type dopants such as Si, Ge, and Sn.

The active layer 12 emits light having a wavelength corresponding to the energy band gap difference according to materials constituting the active layer 12 through the combination of electrons (or holes) injected through the first conductive semiconductor layer 11 and holes (or electrons) injected through the second conductive semiconductor layer 13. The active layer 12 may have one of a single quantum well structure, a multi-quantum well structure, a quantum dot structure, and a quantum wire structure, but the embodiment is not limited thereto.

For example, the active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has the multi-quantum well structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may comprise a P-type semiconductor layer. The second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may comprise one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be disposed on the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

Figure 3:
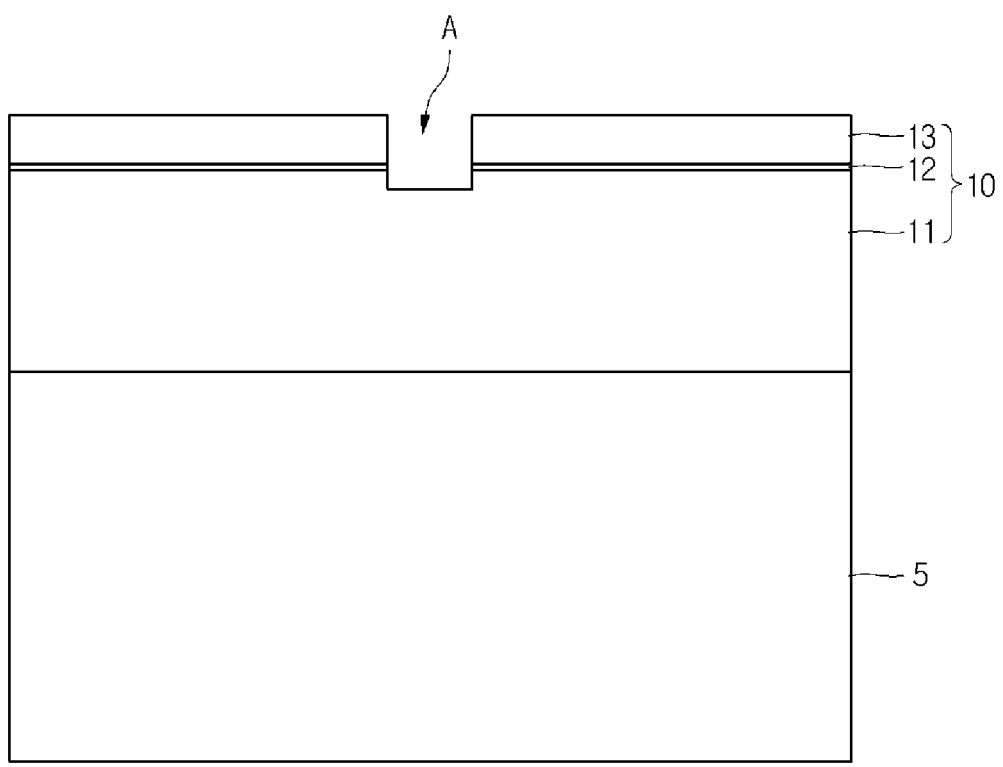

Then, as shown in FIG. 3, a recess A may be formed in the light emitting structure 10. For example, the recess A may be formed through the etching process. The etching process may comprise the dry etching process or the wet etching process. The recess A may be formed through the second conductive semiconductor layer 13 and the active layer 12 through the etching process. The recess A may extend to a part of the first conductive semiconductor layer 11.

Figure 4:
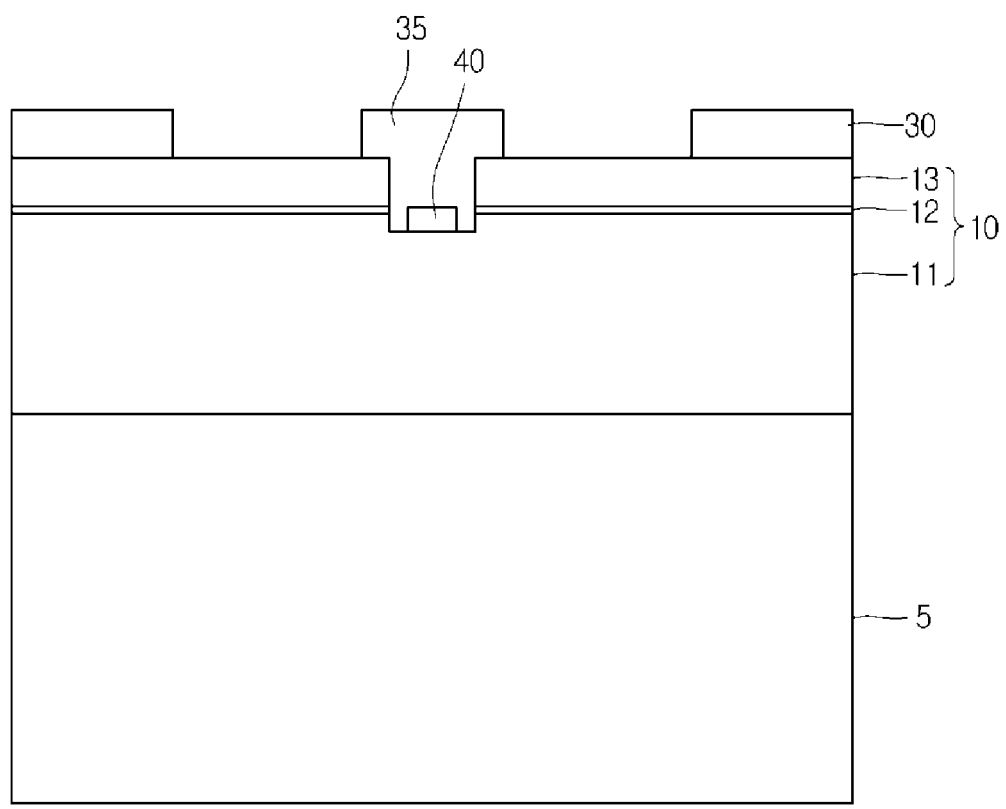

In addition, as shown in FIG. 4, the first metal layer 40 may be formed in the recess A. For example, the first metal layer 40 may have a width in the range of 5 μm to 100 μm and a thickness in the range of 1 nanometer to 1000 nanometer. The first metal layer 40 may comprise at least one of Al, Ag, Ti, V, Cr, Pt, V, Ni, and W.

In addition, the current blocking layer 35 may be formed on the first metal layer 40 and the channel layer 30 may be formed on the second conductive semiconductor layer 13.

The current blocking layer 35 and the channel layer 30 may be formed by using the same material or mutually different materials. The current blocking layer 35 and the channel layer 30 may be formed through the same process or mutually different processes. For instance, the current blocking layer 35 and the channel layer 30 may be formed by using at least one selected from the group consisting of $SiO_2$, SixOy, $Si_3N_4$, SixNy, SiOxNy, $Al_2O_3$, TiO2, and AlN.

Figure 5:
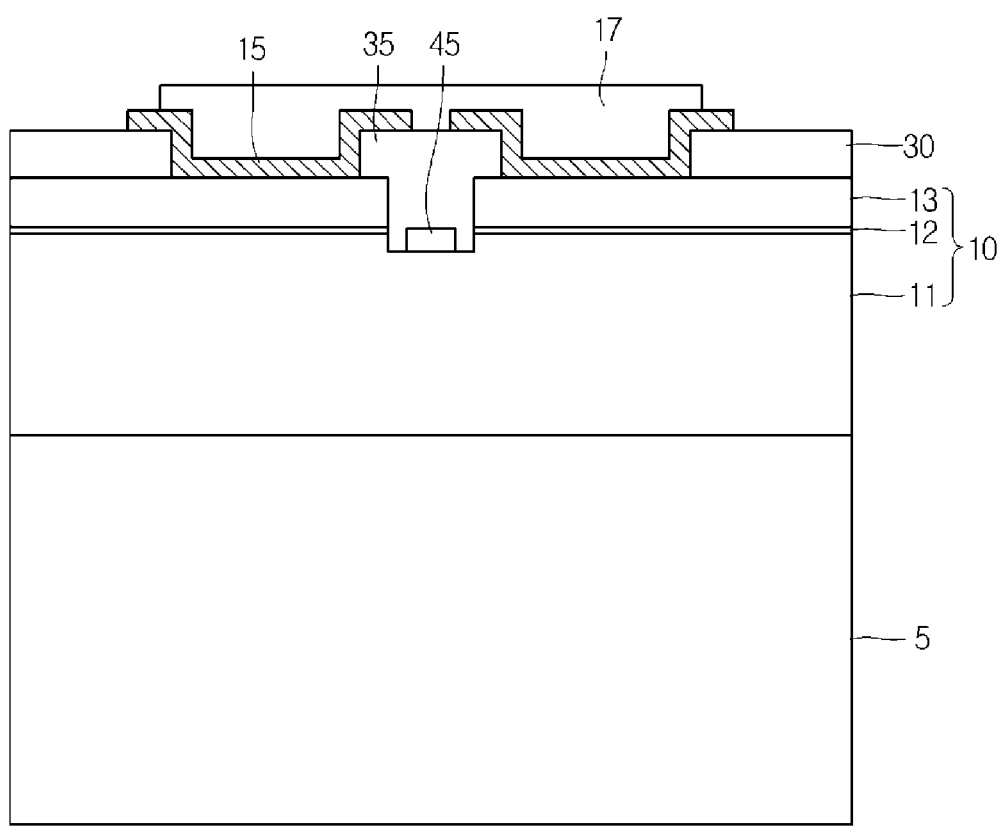

Then, as shown in FIG. 5, the ohmic contact layer 15 and the reflective electrode layer 17 are formed on the second conductive semiconductor layer 13.

The ohmic contact layer 15 may be disposed between the reflective electrode 17 and the second conductive semiconductor layer 13. The ohmic contact layer 15 may make contact with the second conductive semiconductor layer 13.

The ohmic contact layer 15 can make ohmic-contact with the light emitting structure 10. The reflective electrode 17 may be electrically connected to the second conductive semiconductor layer 13.

The ohmic contact layer 15 may be formed by using a transparent conductive oxide layer. For instance, the ohmic contact layer 15 may comprise at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective electrode 17 may be formed by using a material having high reflectivity. For instance, the reflective electrode 17 may be formed by using a metal or an alloy comprising at least one of Ag, Ni, Al, Rh, Pd, Ir, Ru, Mg, Zn, Pt, Cu, Au, and Hf. In addition, the reflective electrode 17 may be prepared as multi-layers by using the above metal or alloy and a transparent conductive material such as ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide) or ATO (Antimony-Tin-Oxide). For example, the reflective electrode 17 according to the embodiment may comprise at least one of Ag, Al, Ag—Pd—Cu alloy and Ag—Cu alloy.

For example, the reflective electrode 17 may be prepared by alternately forming an Ag layer and a Ni layer or may comprise Ni/Ag/Ni, a Ti layer or a Pt layer. In addition, the ohmic contact layer 15 is formed under the reflective electrode 17 and at least a portion of the ohmic contact layer 17 can make ohmic-contact with the light emitting structure 10 through the reflective electrode 17.

Figure 6:
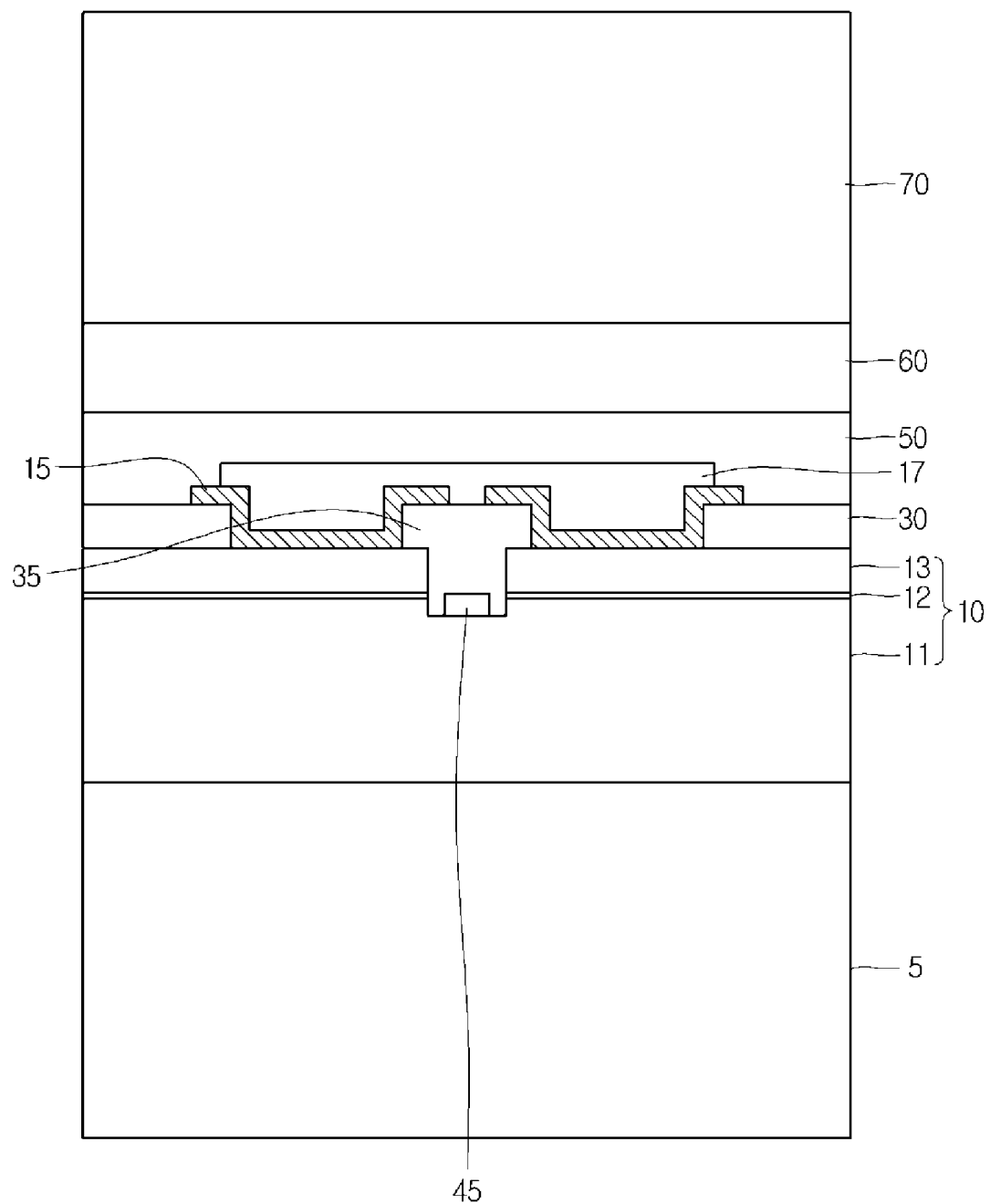

After that, as shown in FIG. 6, the third metal layer 50, the bonding layer 60 and the support member 70 may be formed on the reflective electrode 17.

The third metal layer 50 may comprise at least one of Cu, Ni, Ti, Ti—W, Cr, W, Pt, V, Fe, and Mo. The third metal layer 50 may prevent the material included in the bonding layer 60 from being diffused to the reflective electrode 17 when the bonding layer 60 is provided. The third metal layer 50 may prevent the material, such as Sn, included in the bonding layer 60 from exerting an influence upon the reflective electrode 17.

The bonding layer 60 may comprise a barrier metal or a bonding metal. For instance, the bonding layer 60 may comprise at least one of Ti, Au, Sn, Ni, Cr, Ga, In, Bi, Cu, Ag, Nb, Pd and Ta. The support member 70 supports the light emitting structure 10 and performs the heat dissipation function. The bonding layer 60 may be implemented as a seed layer.

For example, the support member 70 may comprise at least one of Ti, Cr, Ni, Al, Pt, Au, W, Cu, Mo, Cu—W and a semiconductor substrate doped with impurities (i.e., Si, Ge, GaN, GaAs, ZnO, SiC, or SiGe). In addition, the support member 70 may be formed by using an insulating material.

Then, the substrate 5 is removed from the first conductive semiconductor layer 11. For example, the substrate 5 can be removed through a laser lift off (LLO) process. According to the LLO process, laser beam is irradiated onto the bottom surface of the substrate 5 to delaminate the substrate 5 from the first conductive semiconductor layer 11.

Figure 7:
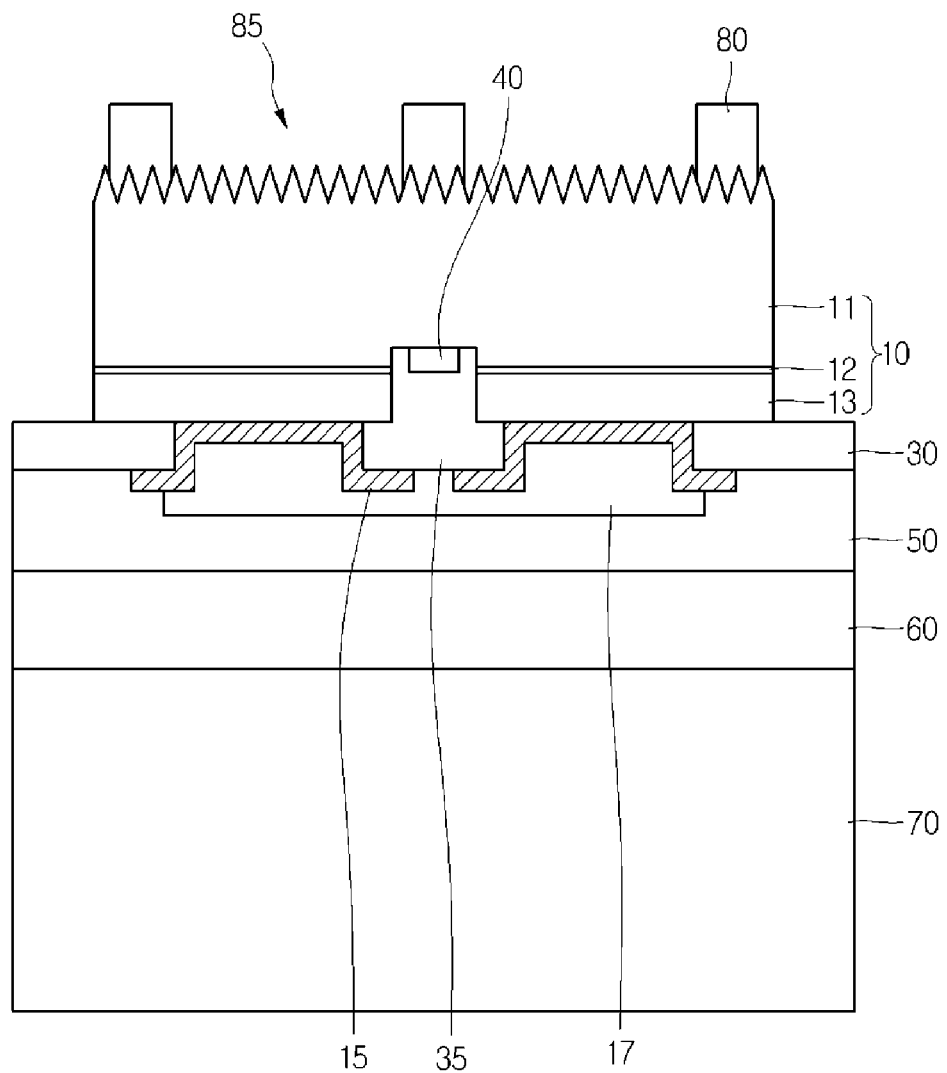

Then, as shown in FIG. 7, the isolation etching process is performed to etch lateral surfaces of the light emitting structure 10 and to expose a portion of the channel layer. The isolation etching process may be performed through the dry etching process, such as an ICP (Inductively Coupled Plasma) process, but the embodiment is not limited thereto.

The roughness 85 may be formed on the top surface of the light emitting structure 10. That is, a light extraction pattern may be formed on the top surface of the light emitting structure 10. In addition, a concavo-convex pattern may be formed on the top surface of the light emitting structure 10. For example, the light extraction pattern may be formed on the top surface of the light emitting structure 10 through the PEC (Photo Electro Chemical) process. Thus, the light extraction efficiency to the outside can be improved.

Then, as shown in FIG. 7, the first electrode 80 may be formed on the light emitting structure 10. The first electrode 80 may be electrically connected to the first conductive semiconductor layer 11. A part of the first electrode 80 can make contact with the first conductive semiconductor layer 11. According to the embodiment, the power can be applied to the light emitting structure 10 through the reflective electrode 17 and the first electrode 80.

The first electrode 80 may comprise the ohmic layer, the intermediate layer and the upper layer. The ohmic layer may comprise one selected from Cr, V, W, Ti and Zn to realize the ohmic contact. The intermediate layer may comprise one selected from Ni, Cu, and Al. The upper layer, for example, may comprise Au. The first electrode 80 may comprise at least one of Cr, V, W, Ti, Zn, Ni, Cu, Al and Au.

Meanwhile, the processes for forming each layer of the light emitting device described above are illustrative purpose only, and the process sequence may be variously modified.

The light emitting device according to the embodiment may comprise the current blocking layer 35 disposed under the light emitting structure 10. The current blocking layer 35 has a top surface disposed in the first conductive semiconductor layer 11 by passing through the active layer 12. The top surface of the current blocking layer 35 can make contact with the first conductive semiconductor layer 11. A portion of the top surface of the current blocking layer 35 and a portion of lateral surfaces of the current blocking layer 35 may physically make contact with the first conductive semiconductor layer 11.

The first metal layer 40 may be disposed on the current blocking layer 35. The first metal layer 40 may be disposed in the first conductive semiconductor layer 11. The first metal layer 40 may make contact with the first conductive semiconductor layer 11.

The first metal layer 40 can make ohmic-contact with the first conductive semiconductor layer 11. Lateral surfaces of the first metal layer 40 may be surrounded by the current blocking layer 35. A bottom surface of the first metal layer 40 may be surrounded by the current blocking layer 35.

A top surface of the first metal layer 40 may be located higher than a top surface of the active layer 12. For example, the first metal layer 40 may have a width in the range of 5 μm to 100 μm and a thickness in the range of 1 nanometer to 1000 nanometer.

The first electrode 80 may be electrically connected to the first conductive semiconductor layer 11. The first electrode 80 may be disposed on the first conductive semiconductor layer 11. The first electrode 80 can make contact with the first conductive semiconductor layer 11. The first metal layer 40 may overlap with the first electrode 80 in the vertical direction.

The light emitting device according to the embodiment may comprise the first metal layer 40 disposed in the first conductive semiconductor layer 11. The first metal layer 40 may have the potential the same as that of the first electrode 80. Since the first metal layer 40 and the first electrode 80 have the same potential, the first metal layer 40 may have resistance against the instant high field. The current spreading effect may be realized by the first metal layer 40. In addition, the operating voltage may be improved, the damage may be prevented in the higher field and the electric reliability can be improved by the first metal layer 40.

Figure 8:
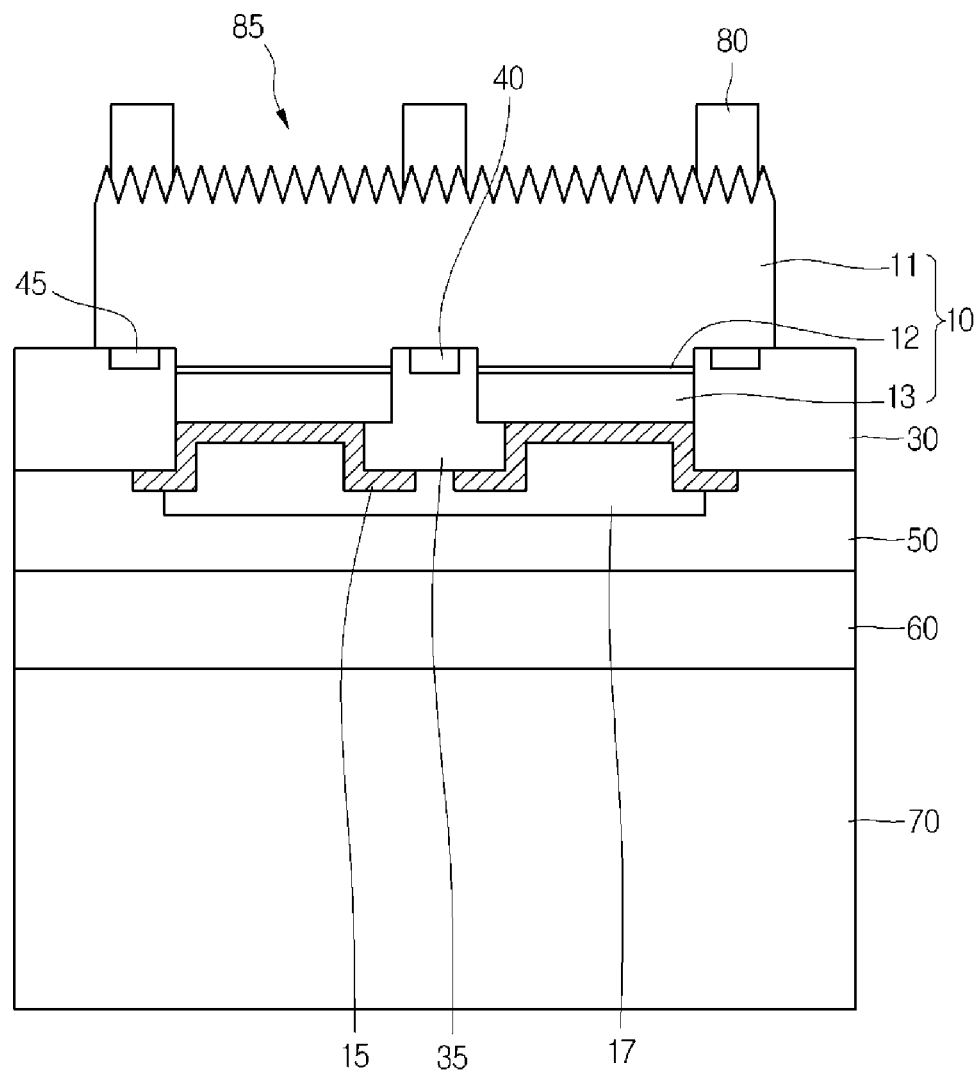
FIG. 8 is a sectional view showing another example of the light emitting device according to an embodiment.

FIG. 8 is a sectional view showing another example of the light emitting device according to the embodiment. In the following description about the light emitting device shown in FIG. 8, the description about the elements and structures explained with reference to FIG. 1 will be omitted in order to avoid redundancy.

The light emitting device according to the embodiment shown in FIG. 8 may comprise a second metal layer 45. The second metal layer 45 may be disposed on the channel layer 30. The second metal layer 45 can make contact with the first conductive semiconductor layer 11. The second metal layer 45 can make ohmic-contact with the first conductive semiconductor layer 11.

A top surface of the channel layer 30 may be located higher than a top surface of the active layer 12. Lateral surfaces and a bottom surface of the second metal layer 45 may be surrounded by the channel layer 30. A top surface of the second metal layer may be located higher than the top surface of the active layer 12.

In addition, according to the embodiment, a portion of the second metal layer 45 may physically make contact with a portion of the first electrode 80. For instance, the second metal layer 45 may physically make contact with the first electrode 80 along the lateral side of the light emitting structure 10. The second metal layer 45 may be electrically connected to the first electrode 80.

The light emitting device according to the embodiment may comprise channel layer 30 and the current blocking layer 35 disposed under the light emitting structure 10. The channel layer 30 and the current blocking layer 35 may have top surfaces disposed in the first conductive semiconductor layer 11 by passing through the active layer 12. The top surfaces of the channel layer 30 and the current blocking layer 35 can make contact with the first conductive semiconductor layer 11. A portion of the top surfaces of the channel layer 30 and the current blocking layer 35 and a portion of lateral surfaces of the channel layer 30 and the current blocking layer 35 may physically make contact with the first conductive semiconductor layer 11.

The first metal layer 40 may be disposed on the current blocking layer 35. The first metal layer 40 may be disposed in the first conductive semiconductor layer 11. The first metal layer 40 may make contact with the first conductive semiconductor layer 11.

The second metal layer 45 may be disposed on the channel layer 30. The second metal layer 45 may be disposed in the first conductive semiconductor layer 11. The second metal layer 45 may make contact with the first conductive semiconductor layer 11.

The first and second metal layers 40 and 45 can make ohmic-contact with the first conductive semiconductor layer 11. Lateral surfaces of the first metal layer 40 may be surrounded by the current blocking layer 35. A bottom surface of the first metal layer 40 may be surrounded by the current blocking layer 35. Lateral surfaces of the second metal layer 45 may be surrounded by the channel layer 30. A bottom surface of the second metal layer 45 may be surrounded by the channel layer 30.

A top surface of the first metal layer 40 may be located higher than a top surface of the active layer 12. A top surface of the second metal layer 45 may be located higher than the top surface of the active layer 12. For example, the first and second metal layers 40 and 45 may have a width in the range of 5 μm to 100 μm and a thickness in the range of 1 nanometer to 1000 nanometer.

The light emitting device according to the embodiment may comprise the first and second metal layers 40 and 45 disposed in the first conductive semiconductor layer 11. The first and second metal layers 40 and 45 may have the potential the same as that of the first electrode 80. Since the first and second metal layers 40 and 45 and the first electrode 80 have the same potential, the first and second metal layers 40 and 45 may have resistance against the instant high field. The current spreading effect may be realized by the first and second metal layers 40 and 45. In addition, the operating voltage may be improved, the damage may be prevented in the higher field and the electric reliability can be improved by the first and second metal layers 40 and 45.

Figure 9:
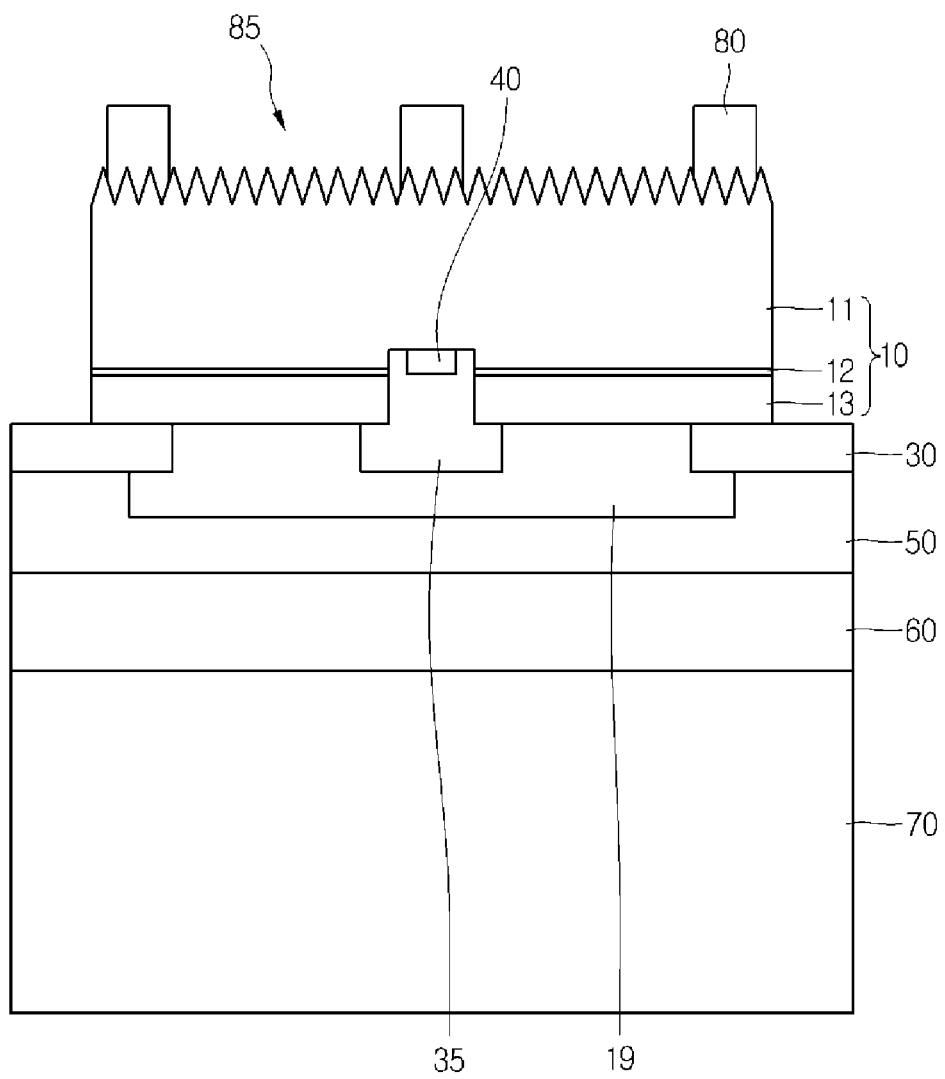
FIGS. 9 and 10 are a sectional view showing a modified example of the light emitting device according to an embodiment.

FIG. 9 is a sectional view showing another example of the light emitting device according to the embodiment. In the following description about the light emitting device shown in FIG. 9, the description about the elements and structures explained with reference to FIG. 1 will be omitted in order to avoid redundancy.

According to the light emitting device of the embodiment, an ohmic reflective electrode 19 may be disposed under the light emitting structure 10. The ohmic reflective electrode 19 may be implemented to have the functions of the reflective electrode 17 and the ohmic contact layer 15. Thus, the ohmic reflective electrode 19 makes ohmic-contact with the second conductive semiconductor layer 13 and reflects the light incident from the light emitting structure 10.

The ohmic reflective electrode 19 may have multiple layers. For example, the ohmic reflective electrode 19 may be prepared by alternately forming an Ag layer and a Ni layer or may comprise Ni/Ag/Ni, a Ti layer or a Pt layer.

The light emitting device according to the embodiment may comprise the current blocking layer 35 disposed under the light emitting structure 10. The current blocking layer 35 has a top surface disposed in the first conductive semiconductor layer 11 by passing through the active layer 12. The top surface of the current blocking layer 35 can make contact with the first conductive semiconductor layer 11. A portion of the top surface of the current blocking layer 35 and a portion of lateral surfaces of the current blocking layer 35 may physically make contact with the first conductive semiconductor layer 11.

The first metal layer 40 may be disposed on the current blocking layer 35. The first metal layer 40 may be disposed in the first conductive semiconductor layer 11. The first metal layer 40 may make contact with the first conductive semiconductor layer 11.

The first metal layer 40 can make ohmic-contact with the first conductive semiconductor layer 11. Lateral surfaces of the first metal layer 40 may be surrounded by the current blocking layer 35. A bottom surface of the first metal layer 40 may be surrounded by the current blocking layer 35.

A top surface of the first metal layer 40 may be located higher than a top surface of the active layer 12. For example, the first metal layer 40 may have a width in the range of 5 μm to 100 μm and a thickness in the range of 1 nanometer to 1000 nanometer.

The first electrode 80 may be electrically connected to the first conductive semiconductor layer 11. The first electrode 80 may be disposed on the first conductive semiconductor layer 11. The first electrode 80 can make contact with the first conductive semiconductor layer 11. The first metal layer 40 may overlap with the first electrode 80 in the vertical direction.

The light emitting device according to the embodiment may comprise the first metal layer 40 disposed in the first conductive semiconductor layer 11. The first metal layer 40 may have the potential the same as that of the first electrode 80. Since the first metal layer 40 and the first electrode 80 have the same potential, the first metal layer 5\40 may have resistance against the instant high field. The current spreading effect may be realized by the first metal layer 40. In addition, the operating voltage may be improved, the damage may be prevented in the higher field and the electric reliability can be improved by the first metal layer 40.

Figure 10:
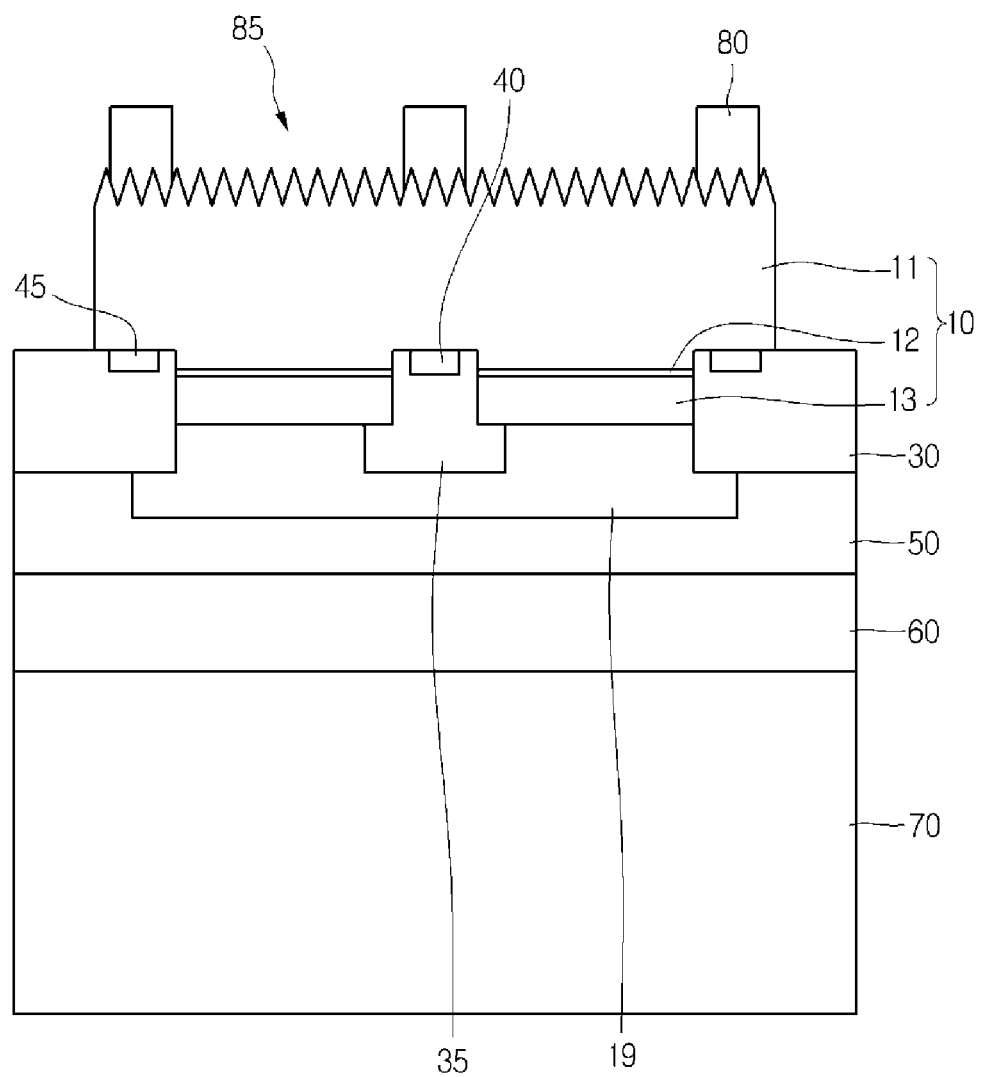

FIG. 10 is a sectional view showing another example of the light emitting device according to the embodiment. In the following description about the light emitting device shown in FIG. 10, the description about the elements and structures explained with reference to FIG. 8 will be omitted in order to avoid redundancy.

According to the light emitting device of the embodiment, an ohmic reflective electrode 19 may be disposed under the light emitting structure 10. The ohmic reflective electrode 19 may be implemented to have the functions of the reflective electrode 17 and the ohmic contact layer 15. Thus, the ohmic reflective electrode 19 makes ohmic-contact with the second conductive semiconductor layer 13 and reflects the light incident from the light emitting structure 10.

The ohmic reflective electrode 19 may have multiple layers. For example, the ohmic reflective electrode 19 may be prepared by alternately forming an Ag layer and a Ni layer or may comprise Ni/Ag/Ni, a Ti layer or a Pt layer.

The light emitting device according to the embodiment may comprise channel layer 30 and the current blocking layer 35 disposed under the light emitting structure 10. The channel layer 30 and the current blocking layer 35 may have top surfaces disposed in the first conductive semiconductor layer 11 by passing through the active layer 12. The top surfaces of the channel layer 30 and the current blocking layer 35 can make contact with the first conductive semiconductor layer 11. A portion of the top surfaces of the channel layer 30 and the current blocking layer 35 and a portion of lateral surfaces of the channel layer 30 and the current blocking layer 35 may physically make contact with the first conductive semiconductor layer 11.

The first metal layer 40 may be disposed on the current blocking layer 35. The first metal layer 40 may be disposed in the first conductive semiconductor layer 11. The first metal layer 40 may make contact with the first conductive semiconductor layer 11.

The second metal layer 45 may be disposed on the channel layer 30. The second metal layer 45 may be disposed in the first conductive semiconductor layer 11. The second metal layer 45 may make contact with the first conductive semiconductor layer 11.

The first and second metal layers 40 and 45 can make ohmic-contact with the first conductive semiconductor layer 11. Lateral surfaces of the first metal layer 40 may be surrounded by the current blocking layer 35. A bottom surface of the first metal layer 40 may be surrounded by the current blocking layer 35. Lateral surfaces of the second metal layer 45 may be surrounded by the channel layer 30. A bottom surface of the second metal layer 45 may be surrounded by the channel layer 30.

A top surface of the first metal layer 40 may be located higher than a top surface of the active layer 12. A top surface of the second metal layer 45 may be located higher than the top surface of the active layer 12. For example, the first and second metal layers 40 and 45 may have a width in the range of 5 μm to 100 μm and a thickness in the range of 1 nanometer to 1000 nanometer.

The light emitting device according to the embodiment may comprise the first and second metal layers 40 and 45 disposed in the first conductive semiconductor layer 11. The first and second metal layers 40 and 45 may have the potential the same as that of the first electrode 80. Since the first and second metal layers 40 and 45 and the first electrode 80 have the same potential, the first and second metal layers 40 and 45 may have resistance against the instant high field. The current spreading effect may be realized by the first and second metal layers 40 and 45. In addition, the operating voltage may be improved, the damage may be prevented in the higher field and the electric reliability can be improved by the first and second metal layers 40 and 45.

Figure 11:
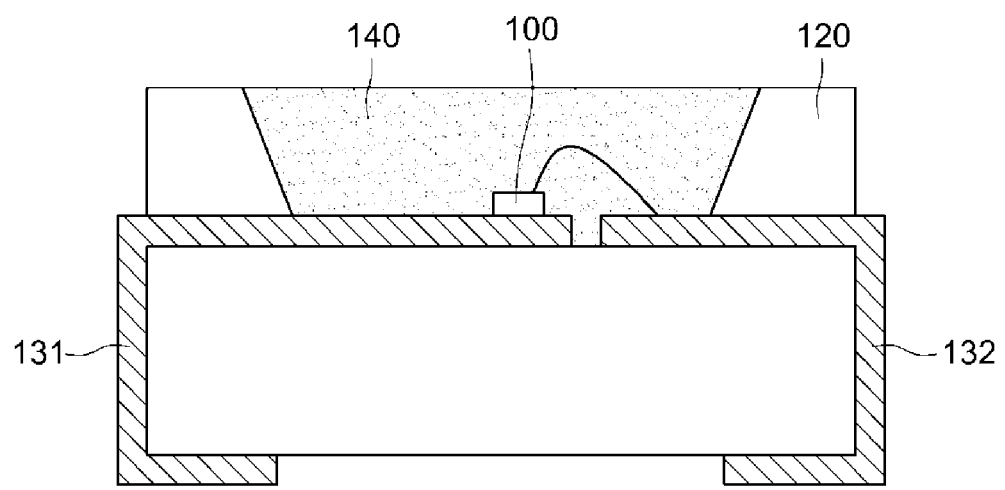
FIG. 11 is a sectional view showing a light emitting device package to which the light emitting device according to an embodiment is applied.

FIG. 11 is a sectional view showing a light emitting device package to which the light emitting device according to the embodiment is applied.

Referring to FIG. 11, the light emitting device package according to the embodiment comprises a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100.

The body 120 may comprise silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may comprise phosphors to change the wavelength of the light emitted from the light emitting device 100.

A plurality of light emitting device or light emitting device packages according to the embodiment may be arrayed on a board, and an optical member comprising a lens, a light guide plate, a prism sheet, or a diffusion sheet may be provided on the optical path of the light emitted from the light emitting device package. The light emitting device package, the board, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can comprise a light emitting device, or a light emitting device package according to the embodiment. For example, the lighting apparatus may comprise a lamp, a signal lamp, an electric sign board and a headlight of a vehicle.

Figure 13:
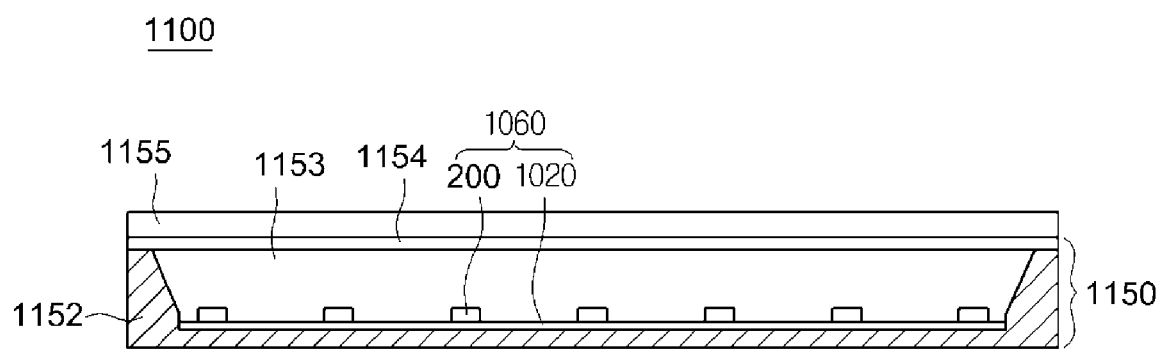
FIG. 13 is a sectional view showing another example of a display apparatus according to an embodiment.
Figure 14:
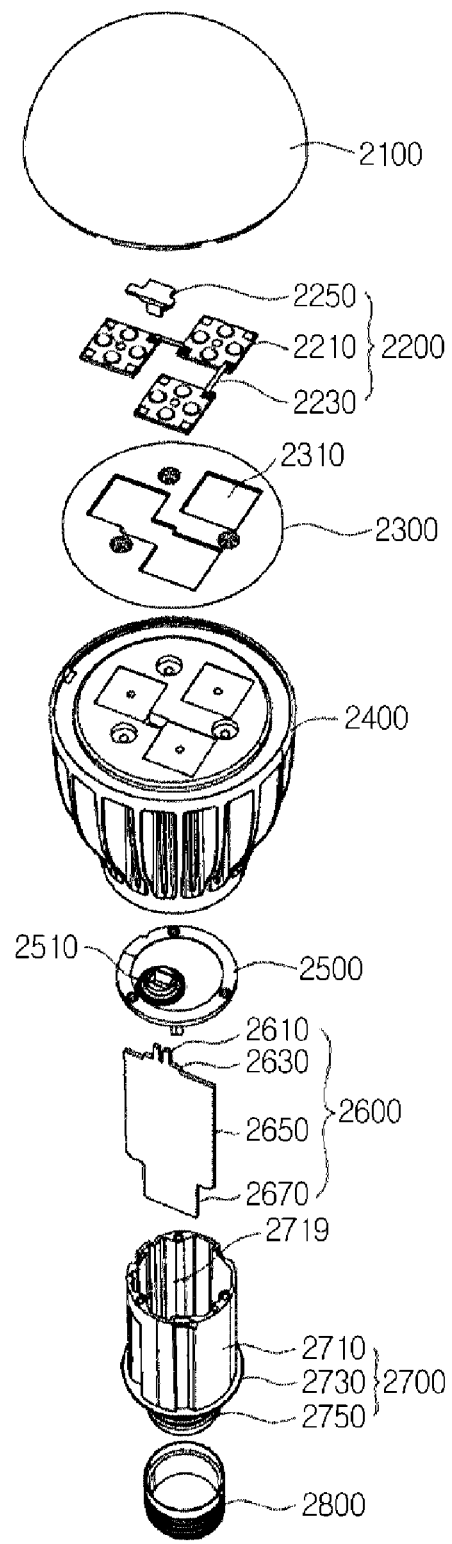
FIG. 14 is a perspective view showing a lighting apparatus according to an embodiment.

The light emitting device according to the embodiment may be applied to the light unit. The light unit has a structure in which a plurality of light emitting devices are arrayed. The light unit may comprise a display device as shown in FIGS. 12 and 13 and the lighting apparatus as shown in FIG. 14.

Figure 12:
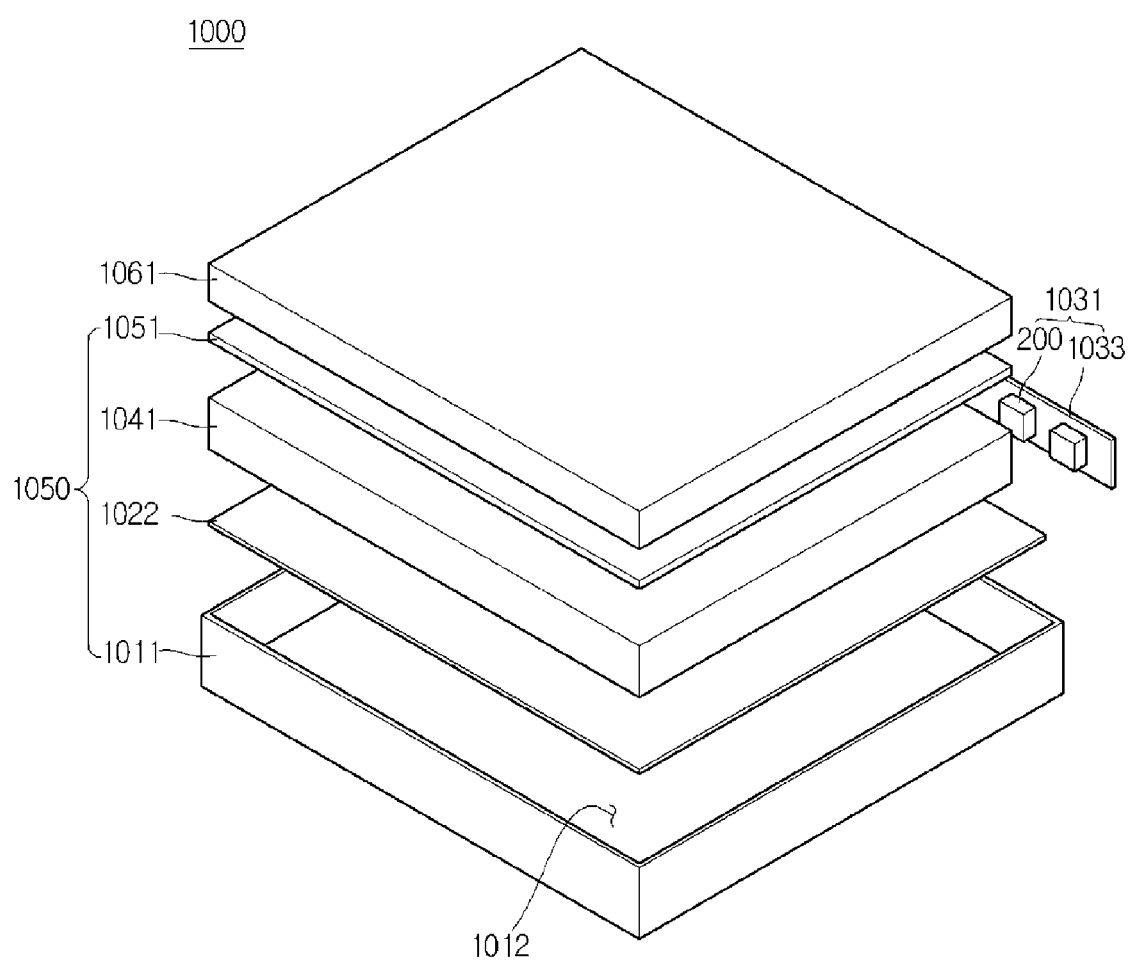
FIG. 12 is a perspective view showing a display apparatus according to an embodiment.

Referring to FIG. 12, a display device 1000 according to the embodiment comprises a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may comprise transparent material. For example, the light guide plate 1041 may comprise one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may comprise a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) comprising a circuit pattern. In addition, the board 1033 may also comprise a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for example, is an LCD panel comprising first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and comprises at least one transmissive sheet. For example, the optical sheet 1051 comprises at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 13 is a sectional view showing another example of a display device according to the embodiment.

Referring to FIG. 13, the display device 1100 comprises a bottom cover 1152, a board 1020 on which the light emitting devices 100 are arrayed, an optical member 1154, and a display panel 1155.

The board 1020 and the light emitting devices 100 may constitute a light emitting module 1060. In addition, the bottom cover 1152, at least one light emitting module 1060, and the optical member 1154 may constitute the light unit.

The bottom cover 1152 can be provided therein with a receiving section 1153, but the embodiment is not limited thereto.

In this case, the optical member 1154 may comprise at least one of a lens, a light guide plate, a diffusion sheet, horizontal and vertical prism sheets, and a brightness enhanced sheet. The light guide plate may comprise PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 14 is a perspective view showing a lighting apparatus according to the embodiment.

Referring to FIG. 14 the lighting apparatus according to the embodiment may comprise a cover 2100, a light source module 2200, a radiator 2400, a power supply part 2600, an inner case 2700, and a socket 2800. The lighting apparatus according to the embodiment may further comprise at least one of a member 2300 and a holder 2500. The light source module 2200 may comprise the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may comprise a coupling part which is coupled with the radiator 2400.

The cover 2100 may comprise an inner surface coated with a milk-white pigment. The milk-white pigment may comprise a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may comprise glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may comprise a light source 2210, a connection plate 2230, and a connector 2250.

The member 2300 is disposed on a top surface of the radiator 2400, and comprises guide recesses 2310 into which a plurality of light sources 2210 and the connector 2250 are inserted. The guide recesses 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100.

Accordingly, the light efficiency of the lighting apparatus according to the embodiment may be improved.

For example, the member 2300 may comprise an insulating material. The connection plate 2230 of the light source module 2200 may comprise an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving recess 2719 of an insulating part 2710 of an inner case 2700. Accordingly, the power supply part 2600 received in the insulating part 2710 of the inner case 2700 is sealed. The holder 2500 comprises a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving recess 2719 of the inner case 2700, and is sealed inside the inner case 2700 by the holder 2500.

The power supply part 2600 may comprise a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may comprise a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may comprise a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive semiconductor layer, an active layer adjacent to the first conductive semiconductor layer, and a second conductive semiconductor layer adjacent to the active layer;
a first electrode electrically coupled to the first conductive semiconductor layer;
a current blocking layer provided adjacent to the light emitting structure and having a top surface disposed in the first conductive semiconductor layer by passing through the active layer;
a first metal layer provided over the current blocking layer and contacting the first conductive semiconductor layer;
a reflective electrode electrically coupled to the second conductive semiconductor layer;
a channel layer disposed around a lower portion of the light emitting structure; and
a second metal layer disposed on the channel layer and contacting the first conductive semiconductor layer,
wherein both the first metal layer and the second metal layer are not physically and directly connected to the first electrode.

2. The light emitting device of claim 1, wherein the first metal layer makes ohmic-contact with the first conductive semiconductor layer.

3. The light emitting device of claim 1, wherein lateral surfaces and a bottom surface of the first metal layer are surrounded by the current blocking layer.

4. The light emitting device of claim 1, wherein a top surface of the first metal layer is located higher than a top surface of the active layer.

5. The light emitting device of claim 1, wherein the first metal layer overlaps with the first electrode in a vertical direction.

6. The light emitting device of claim 1, wherein the first electrode is disposed on the first conductive semiconductor layer and contacts the first conductive semiconductor layer.

7. The light emitting device of claim 1, wherein the reflective electrode is disposed under the second conductive semiconductor layer.

8. The light emitting device of claim 1, further comprising an ohmic-contact layer between the reflective electrode and the second conductive semiconductor layer.

9. The light emitting device of claim 1, wherein the second metal layer makes ohmic-contact with the first conductive semiconductor layer.

10. The light emitting device of claim 1, wherein lateral surfaces and a bottom surface of the second metal layer are surrounded by the channel layer.

11. The light emitting device of claim 1, wherein a top surface of the second metal layer is located higher than a top surface of the active layer.

12. The light emitting device of claim 1, wherein the first metal layer or the second metal layer has a width in a range of about 5μm to about 100μm.

13. The light emitting device of claim 1, wherein the first metal layer or the second metal layer has a thickness in a range of about 1 nanometer to about 1000 nanometer.

14. The light emitting device of claim 1, wherein a top surface of the channel layer is located higher than a top surface of the active layer.

15. The light emitting device of claim 1, wherein an entire top surface of the first metal layer contacts the first conductive semiconductor layer, and an entire top surface of the second metal layer contacts the first conductive semiconductor layer.

16. The light emitting device of claim 1, wherein a top surface of the first metal layer and a top surface of the second metal layer are not exposed to an outside of a side surface of the light emitting structure.

17. A light emitting device comprising:
a light emitting structure including a first conductive semiconductor layer, an active layer adjacent to the first conductive semiconductor layer, and a second conductive semiconductor layer adjacent to the active layer;
a first electrode electrically coupled to the first conductive semiconductor layer;
a current blocking layer provided adjacent to the light emitting structure and having a top surface disposed in the first conductive semiconductor layer by passing through the active layer;
a first metal layer provided over the current blocking layer and contacting the first conductive semiconductor layer;
a reflective electrode electrically coupled to the second conductive semiconductor layer;
a channel layer disposed around a lower portion of the light emitting structure; and
a second metal layer disposed on the channel layer and contacting the first conductive semiconductor layer,
wherein an entire top surface of the first metal layer contacts the first conductive semiconductor layer, and an entire top surface of the second metal layer contacts the first conductive semiconductor layer,
wherein lateral surfaces and a bottom surface of the first metal layer are surrounded by the current blocking layer, and
wherein a top surface of the first metal layer is located higher than a top surface of the active layer.

18. The light emitting device of claim 17, wherein the first metal layer overlaps with the first electrode in a vertical direction.

19. The light emitting device of claim 17, wherein both the first metal layer and the second metal layer are not physically and directly connected to the first electrode.

20. A light emitting device comprising:
a light emitting structure including a first conductive semiconductor layer, an active layer under the first conductive semiconductor layer, and a second conductive semiconductor layer under the active layer;
a first electrode electrically connected to the first conductive semiconductor layer;
a current blocking layer disposed under the light emitting structure and having a top surface disposed in the first conductive semiconductor layer by passing through the active layer;
a first metal layer disposed on the current blocking layer and contacting the first conductive semiconductor layer;
a reflective electrode electrically connected to the second conductive semiconductor layer;
a channel layer around a lower portion of the light emitting structure; and
a second metal layer disposed on the channel layer and contacting the first conductive semiconductor layer,
wherein a top surface of the first metal layer and a top surface of the second metal layer are not exposed to an outside of a side surface of the light emitting structure.

* * * * *